United States Patent
Chen (10) Patent No.: US 12,356,583 B2
(45) Date of Patent: Jul. 8, 2025

(54) HEAT DISSIPATION MODULE AND ELECTRONIC DEVICE

(71) Applicant: Nanning FuLian FuGui Precision Industrial Co., Ltd., Nanning (CN)

(72) Inventor: Chun-Yuan Chen, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 250 days.

(21) Appl. No.: 18/220,866

(22) Filed: Jul. 12, 2023

(65) Prior Publication Data
US 2025/0024633 A1 Jan. 16, 2025

(51) Int. Cl.
*H05K 7/20* (2006.01)

(52) U.S. Cl.
CPC ..... *H05K 7/20172* (2013.01); *H05K 7/20145* (2013.01); *H05K 7/20745* (2013.01)

(58) Field of Classification Search
CPC ........... H05K 7/20172; H05K 7/20145; H05K 7/20745; G06F 1/20
See application file for complete search history.

(56) References Cited

U.S. PATENT DOCUMENTS

| | | | | |
|---|---|---|---|---|
| 8,320,120 B1* | 11/2012 | Chan | | H05K 7/20727 165/122 |
| 8,873,236 B1* | 10/2014 | Tamarkin | | F04D 29/601 361/679.48 |
| 9,017,020 B2* | 4/2015 | Charest | | F04D 25/0613 415/213.1 |
| 9,173,323 B2* | 10/2015 | Liao | | H05K 7/20727 |
| 9,173,326 B1* | 10/2015 | Smith | | H05K 7/20727 |
| 9,458,854 B2* | 10/2016 | Cananzi | | F04D 25/0693 |
| 9,999,161 B2* | 6/2018 | Mease | | H05K 7/20727 |
| 12,256,517 B2* | 3/2025 | Hatol | | F04D 25/0613 |
| 2007/0076368 A1* | 4/2007 | Pike | | G06F 1/20 361/679.48 |
| 2012/0140406 A1* | 6/2012 | Kliewer | | G06F 1/20 361/679.48 |

(Continued)

FOREIGN PATENT DOCUMENTS

| CN | 106919230 A | * | 7/2017 | ............ G06F 1/183 |
|---|---|---|---|---|
| CN | 107835616 A | | 3/2018 | |

(Continued)

OTHER PUBLICATIONS

Huang Yingrui, "Fixing apparatus", Jul. 4, 2017, Nanning Fugui Prec Ind Co Ltd, Hon Hai Prec Ind Co Ltd, Entire Document (Translation of CN 106919230) (Year: 2017).*

*Primary Examiner* — Stephen S Sul
(74) *Attorney, Agent, or Firm* — ScienBiziP, P.C.

(57) ABSTRACT

A heat dissipation module includes a housing defining a receiving space for accommodating a fan, a turntable, and an expansion mechanism. The housing includes a top plate and two side walls connected to opposite ends of the top plate. The fan is configured for generating airflow from one side wall to the other. The turntable is connected to the expansion mechanism. The turntable rotates into a locked position to extend the expansion mechanism to protrude from the housing, and the turntable deviates from the locked position to retract the expansion mechanism back into the housing. An electronic device including the heat dissipation module is also provided.

18 Claims, 12 Drawing Sheets

(56) References Cited

U.S. PATENT DOCUMENTS

2016/0150675 A1* 5/2016 Wilcox ................. F04D 29/522
                                                          361/692
2022/0225535 A1* 7/2022 Yow ................... H05K 7/20727

FOREIGN PATENT DOCUMENTS

| CN | 216057860 U | 3/2022 |
| CN | 112804838 B | 8/2022 |
| CN | 112654195 B | 11/2022 |
| TW | 201228575 A | 7/2012 |
| TW | I772131 B | 7/2022 |

* cited by examiner

HEAT DISSIPATION MODULE AND ELECTRONIC DEVICE

FIELD

The subject matter relates to electronic device heat dissipation technologies, and more particularly to a heat dissipation module and an electronic device.

BACKGROUND

Electronic devices typically use fan modules for heat dissipation. The fan modules are usually attached to the electronic devices by screws and include handles to assist with the installation and removal of the fan module. However, the screws and handles protruding from the fan module and the outer shell of the electronic device not only affect the appearance but also impacts the space available for arranging other components of the electronic device. Additionally, for electronic devices that require the airflow direction of the fan module to be changed, the locking and loosening of the screws can be time-consuming.

Therefore, there is room for improvement within the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the disclosure.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the disclosure, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the disclosure is presented herein with reference to the figures by way of exemplification and not as limitation.

Figure 1:
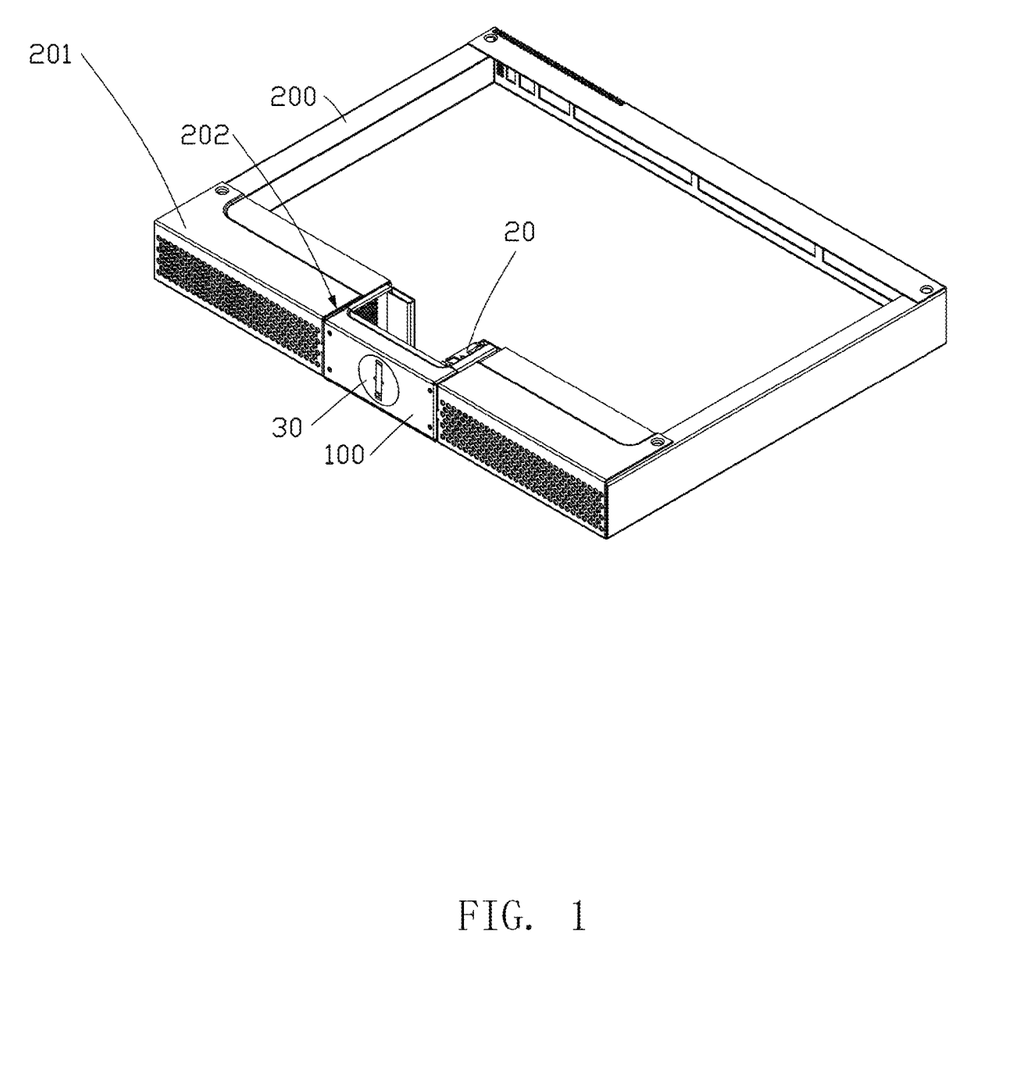
FIG. 1 is a schematic view of state of use illustrating a heat dissipation module according to an embodiment of the present application.

Referring to FIG. 1, a heat dissipation module 100 is provided for being installed in an electronic device 200 for heat dissipation. The electronic device 200 is equipped with an installation slot 202, and the heat dissipation module 100 can be detachably installed in the installation slot 202. The installation slot 202 is shaped to match the heat dissipation module 100, allowing the heat dissipation module 100 to be removed, flipped 180°, and reinserted into the installation slot to change the airflow direction of the heat dissipation module 100 within the electronic device 200.

Figure 2:
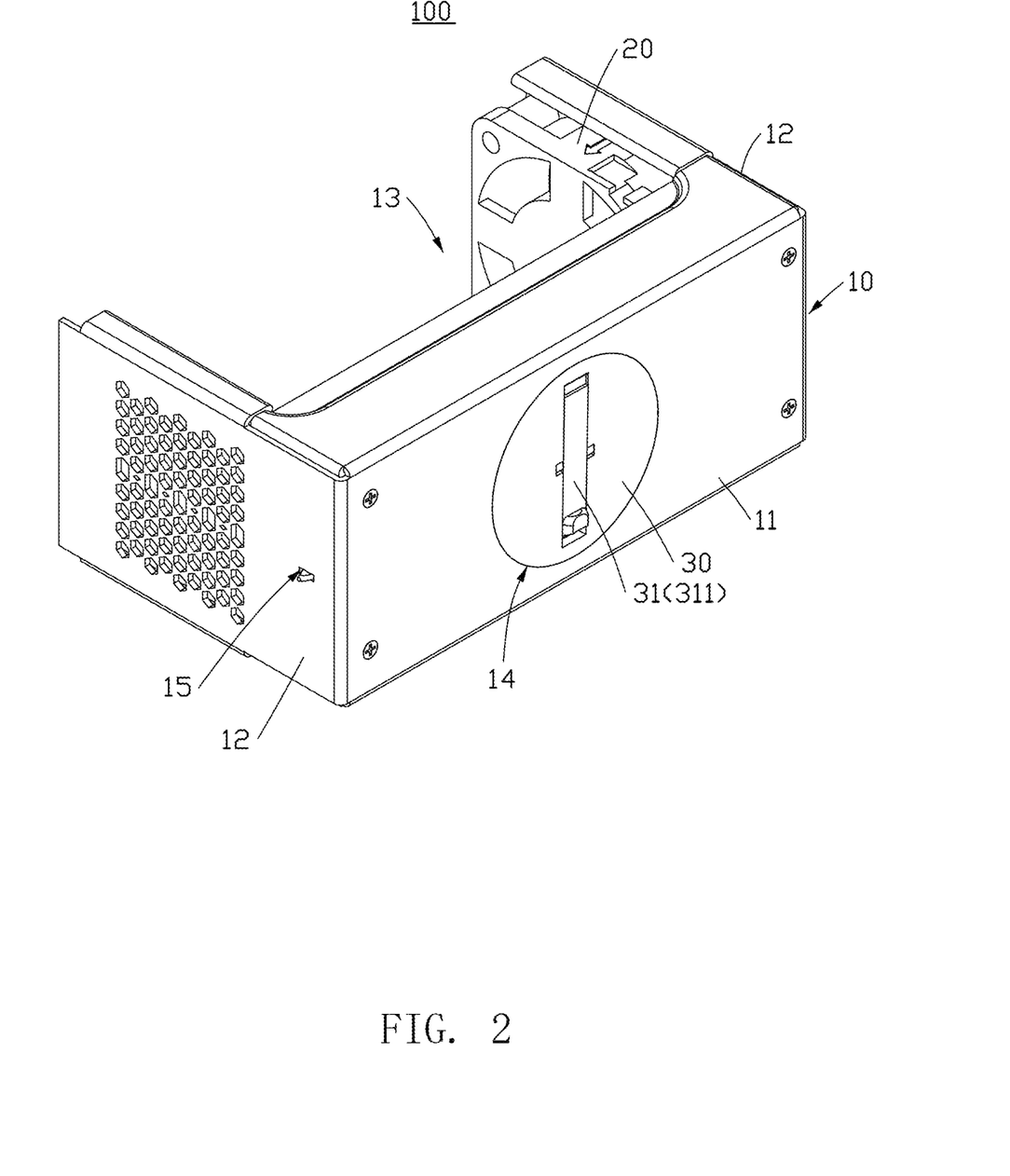
FIG. 2 is a perspective view of the heat dissipation module according to an embodiment of the present application.
Figure 3:
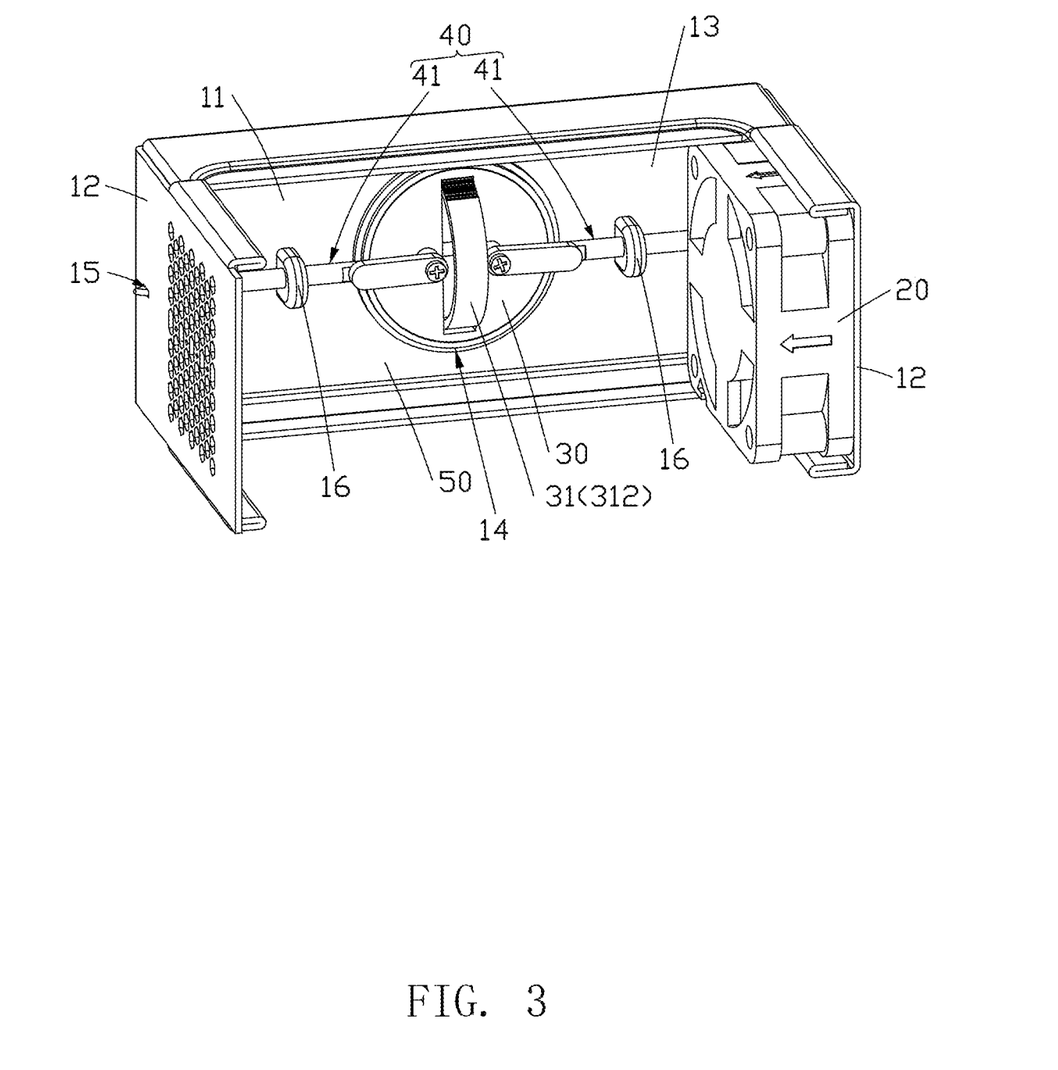
FIG. 3 is another perspective view of the heat dissipation module in FIG. 2.

As illustrated in FIG. 2 and FIG. 3, the heat dissipation module 100 includes a housing 10, a fan 20, a turntable 30, and an expansion mechanism 40. The housing 10 includes a top plate 11 and two side walls 12 connected to opposite ends of the top plate 11. The top plate 11 and the two side walls 12 define a receiving space 13 to accommodate the fan 20 and the expansion mechanism 40. The fan 20 generates airflow from one side wall 12 to the other side wall 12. The top plate 11 defines a mounting hole 14 for mounting the turntable 30, which is rotatably positioned in the mounting hole 14. Each of the two side walls 12 defines a through hole 15, and the expansion mechanism 40 extends through the through hole 15 to protrude from the housing 10 when expanded.

Specifically, the expansion mechanism 40 includes two sets of linkage assemblies 41 symmetrically arranged relative to the turntable 30, and the two sets of linkage assemblies 41 are connected to the turntable 30. The turntable 30 is configured for selectively rotating into a locked position A (as shown in FIG. 5), extending the two sets of linkage assemblies 41 through the through holes 15 on the two side walls 12 and protrude from the housing 10, and the turntable 30 is further configured for selectively rotating to deviate from the locked position A, driving the two sets of linkage assemblies 41 to retract into the housing 10 via the through holes 15 on the two side walls 12.

Therefore, in operation, the turntable 30 is rotated to the locked position A, causing the two sets of linkage assemblies 41 of the expansion mechanism 40 to extend via the through holes 15 on the two side walls 12 and protrude from the housing 10 of the heat dissipation module 100. This allows the heat dissipation module 100 to be securely fixed in its operating environment such as a switch or other electronic devices 200 by the protruding linkage assemblies 41. When the heat dissipation module 100 requires to be removed, the turntable 30 is rotated away from the locked position A, causing the two sets of linkage assemblies 41 in the expansion mechanism 40 to retract into the housing 10 of the heat dissipation module 100, allowing the heat dissipation module 100 to be detached from its operating environment, such as a switch or other electronic devices 200. Further, the housing 10 of the heat dissipation module 100 has a symmetrical shape, which enables the heat dissipation module 100 to be turned over and reinstalled in the electronic device 200 to change the airflow direction of the heat dissipation module 100.

Figure 4:
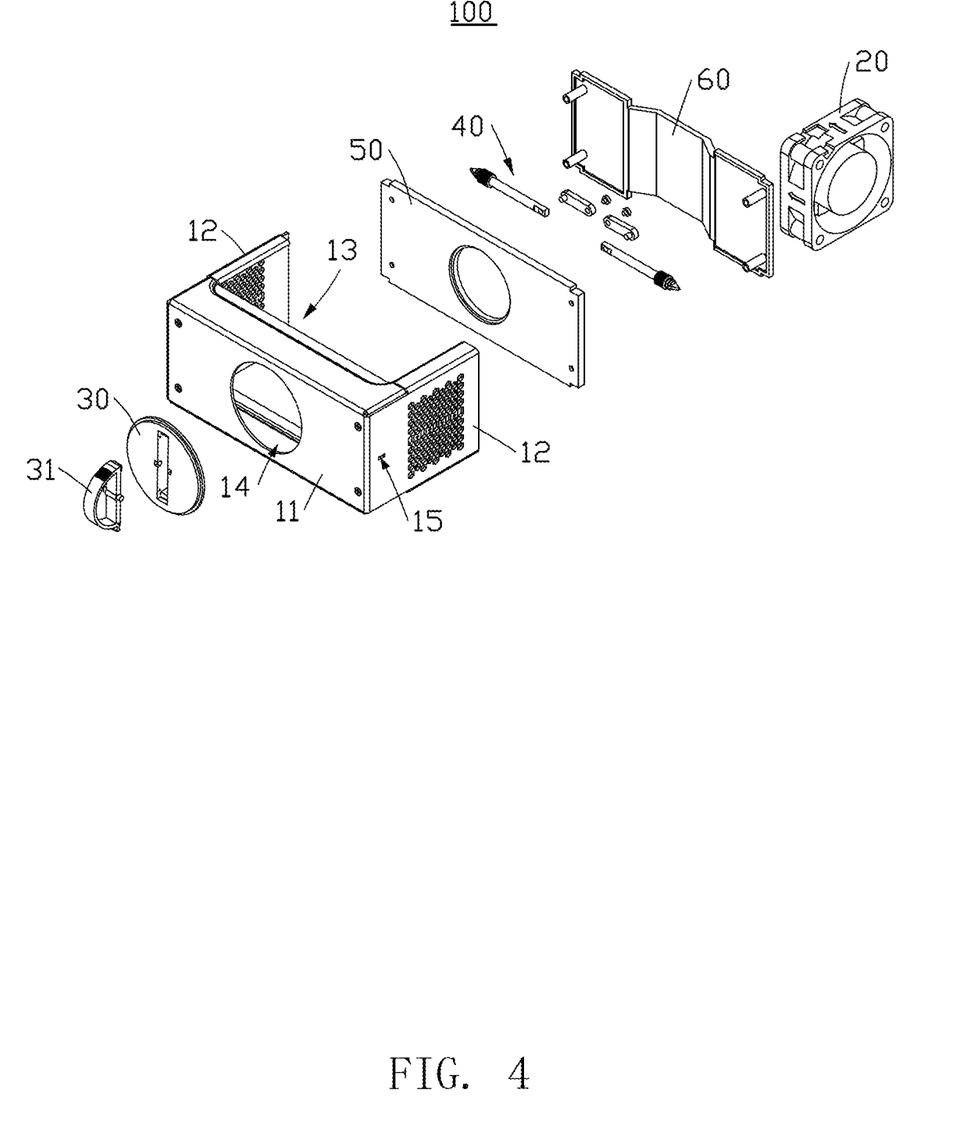
FIG. 4 is an explosive view of the heat dissipation module in FIG. 2.
Figure 5:
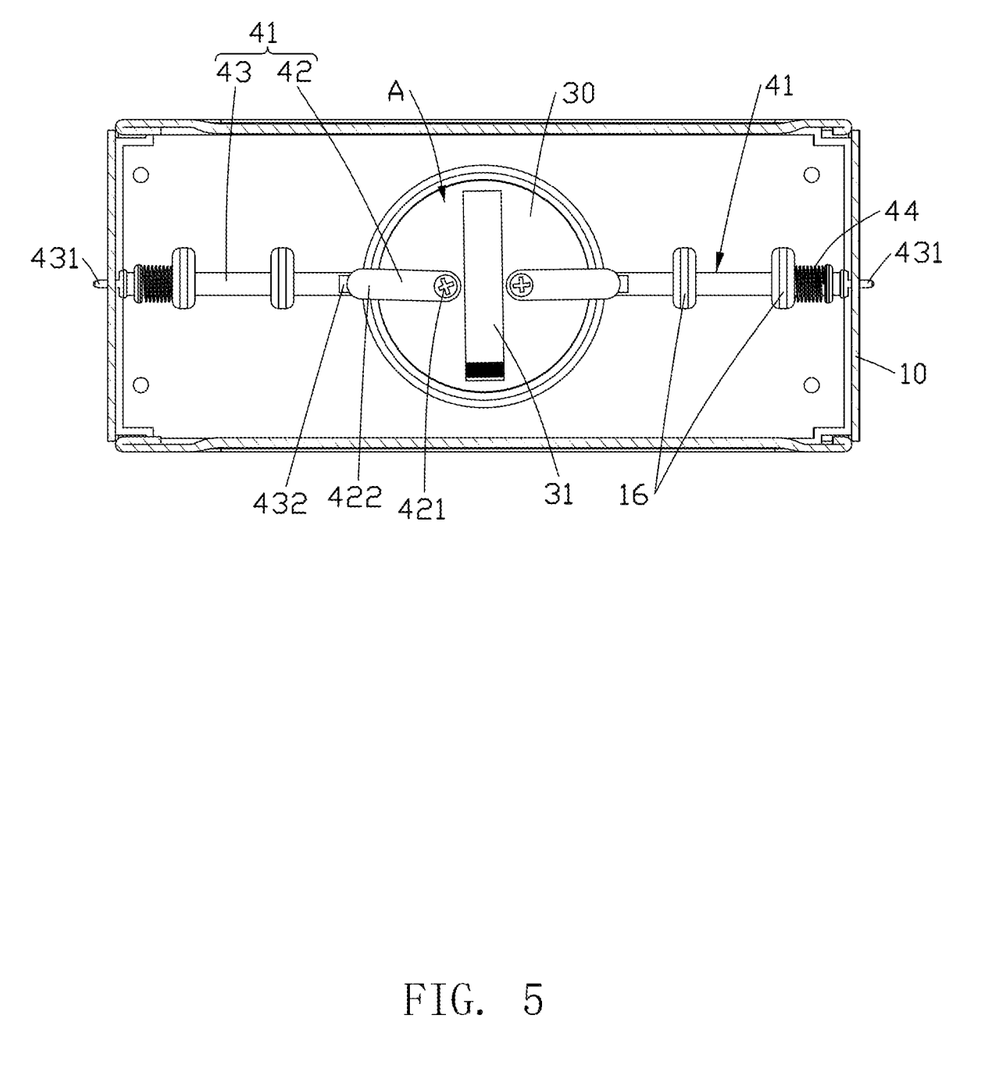
FIG. 5 is a schematic view of an expansion mechanism of the heat dissipation module, with a turntable in a locked position.

Alternatively, as shown in FIG. 3, FIG. 4, and FIG. 5, a first end 421 of each set of linkage assembly 41 is rotatably connected to the turntable 30, while an second end 431 is movably inserted into the corresponding through hole 15 on the respective side wall 12 in a telescopic manner. The second end 431 is away from the first end 421. When the turntable 30 is in the locked position A, the second end 431 of each set of linkage assembly 41 is inserted into the corresponding through hole 15 and protrudes from the housing 10 to secure the housing 10. When the turntable 30 deviates from the locked position A, the two sets of linkage assemblies 41 are driven close to each other by the turntable and causing the second end 431 of each set of linkage assembly 41 to retract back into the housing 10.

Figure 6:
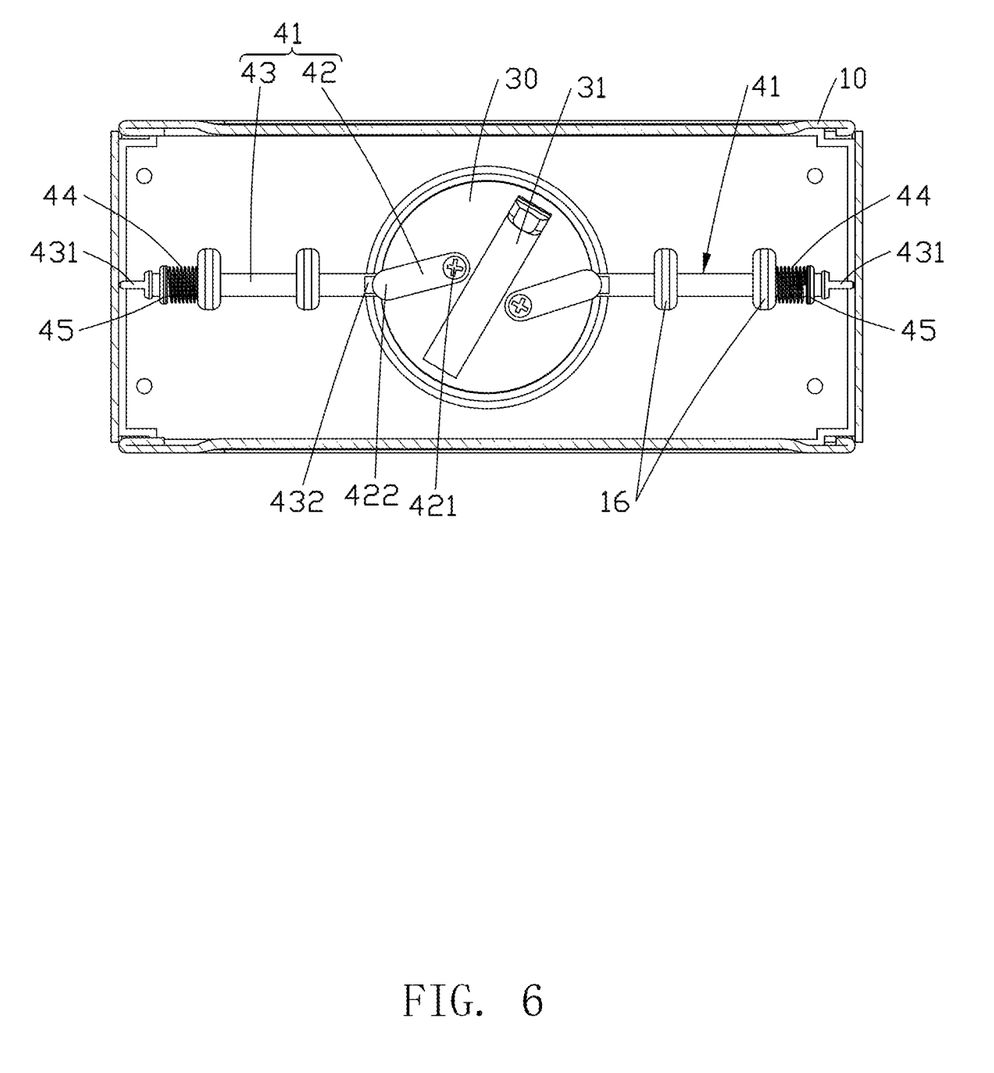
FIG. 6 is a schematic view of the extensible structure of the heat dissipation module, with the turntable deviating from the locked position.

According to some embodiment, each set of linkage assembly 41 includes a swing rod 42 and a locking rod 43 rotatably connected to the swing rod 42. The swing rod 42 includes a pivot end 421 and a swing end 422 away from the pivot end 421, while the locking rod 43 includes a locking end 431 and a transmission end 432 away from the locking end 431. The pivot end 421 of the swing rod 42 is rotatably mounted on the turntable 30, and the swing end 422 is rotatably connected to the transmission end 432 of the locking rod 43. The locking end 431 of the locking rod 43 is movably inserted into the through hole 15. As shown in FIG. 5 and FIG. 6, when the turntable 30 is in the locked position A, the locking end 431 of the locking rod 43 protrudes from the housing 10 via the through hole 15. When the turntable 30 rotates to deviate from the locked position A, the swing rod 42 and the locking rod 43 can be pulled inward, causing the locking end 431 to retract into the housing 10.

In this embodiment, the top plate 11 is equipped with two limiting members 16 on opposite sides of the mounting hole 14. Each locking rod 43 penetrates through and moves along one of the two limiting members 16 when the turntable 30 rotates. The limiting members 16 restrict the movement direction of the locking rods 43, ensuring that the locking rods 43 can accurately extend into and retract from the through hole 15, and prevents the locking rod 43 from deviating during telescopic movement.

According to some embodiments, referring to FIG. 5 and FIG. 6, the top plate 11 is equipped with four limiting members 16, two of which are located on each side of the mounting hole 14. In this embodiment, the locking rod of each linkage assembly 41 penetrates through two limiting members 16 and moves along the two limiting members when the turntable rotates.

In this embodiment, the limiting members 16 are located on the top plate 11. It should be understood that in some embodiments, the heat dissipation module 100 may include a mounting plate 50. The mounting plate 50 is positioned within the receiving space 13 and connected to the top plate 11. The mounting hole 14 penetrates through the mounting plate 50, and the limiting members 16 are arranged on the mounting plate 50.

According to further embodiments, each linkage assembly 41 further includes a resilient member 44. The resilient member 44 is sleeved on the locking rod 43 and is used to push the locking rod 43 so that the locking end 431 protrudes from the housing 10. Therefore, the expansion mechanism 40 will not contract to allow the heat dissipation module 100 to be detached from the electronic device 200 unless an external force is applied to rotate the turntable 30 to deviate from the locking position A. When the external force is removed, the resilient members 44 push the locking rod 43 so that the locking end 431 extends through the through holes 15 and protrudes from the housing 10, securing the heat dissipation module 100 to the electronic device 200.

In this embodiment, each locking rod 43 is equipped with a flange 45 near the locking end 431. The resilient members 44 abuts between the limiting members 16 and the flanges 45.

In this embodiment, the cross-sectional dimension of the locking end 431 gradually decreases along the direction protruding from the housing 10, forming a tapered tip or a latchbolt with a beveled striker surface. Therefore, when detaching the heat dissipation module 100, the external force is required to apply to rotate the turntable 30 away from the locked position A to retract the expansion mechanism 40. When installing the heat dissipation module 100, the heat dissipation module 100 can be directly inserted into the mounting slot of the electronic device, such as a switch. The slot wall of the mounting slot compresses the beveled striker surface of the locking end 431, causing the expansion mechanism 40 to retract into the housing 10. Thus, the installation of the heat dissipation module 100 can be achieved without applying external force to rotate the turntable 30 away from the locked position.

In this embodiment, the expansion mechanism 40 is implemented by the linkage assembly 41 that are rotatably connected to the turntable 30. It should be understood that the expansion mechanism 40 can be implemented in other forms. For example, the turntable 30 may have a cam structure on the side facing the receiving space 13, and the outer edge of the cam structure may have grooves. One end of each linkage assembly 41 can be slidably positioned in the grooves of the cam structure. When the turntable 30 is in the locked position A, the cam structure pushes the two sets of linkage assemblies 41 outward, causing them to protrude via the through holes 15 on the two side walls 12 of the housing 10. When the turntable 30 rotates to deviate away from the locked position A, the cam rotates with the turntable 30 and pulls the linkage assemblies 41 to retract, causing the two sets of linkage assemblies 41 to retract via the through holes 15 on the two side walls 12 into the housing 10.

Figure 7:
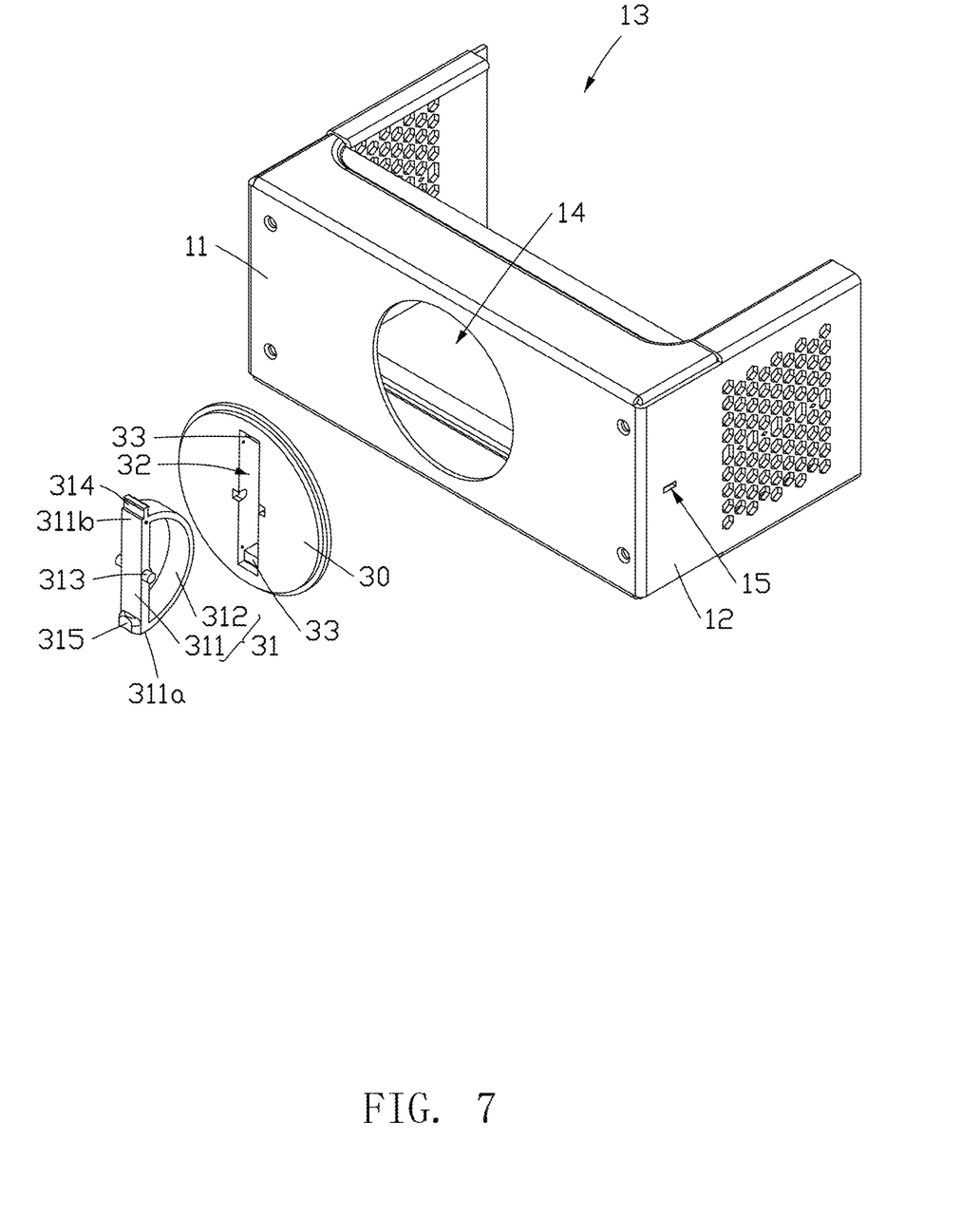
FIG. 7 is an explosive view of the turntable of the heat dissipation module according to an embodiment of the present application.
Figure 8:
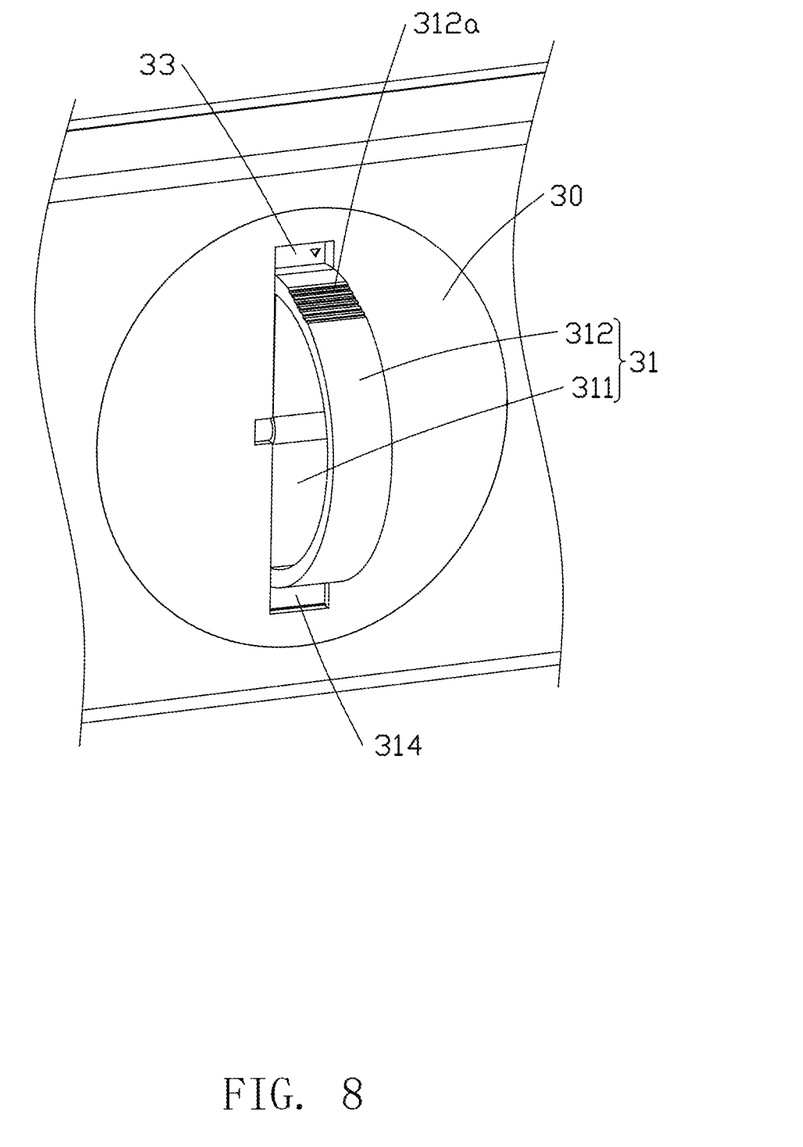
FIG. 8 is a perspective view of a handle protruding from the turntable in FIG. 7.
Figure 9:
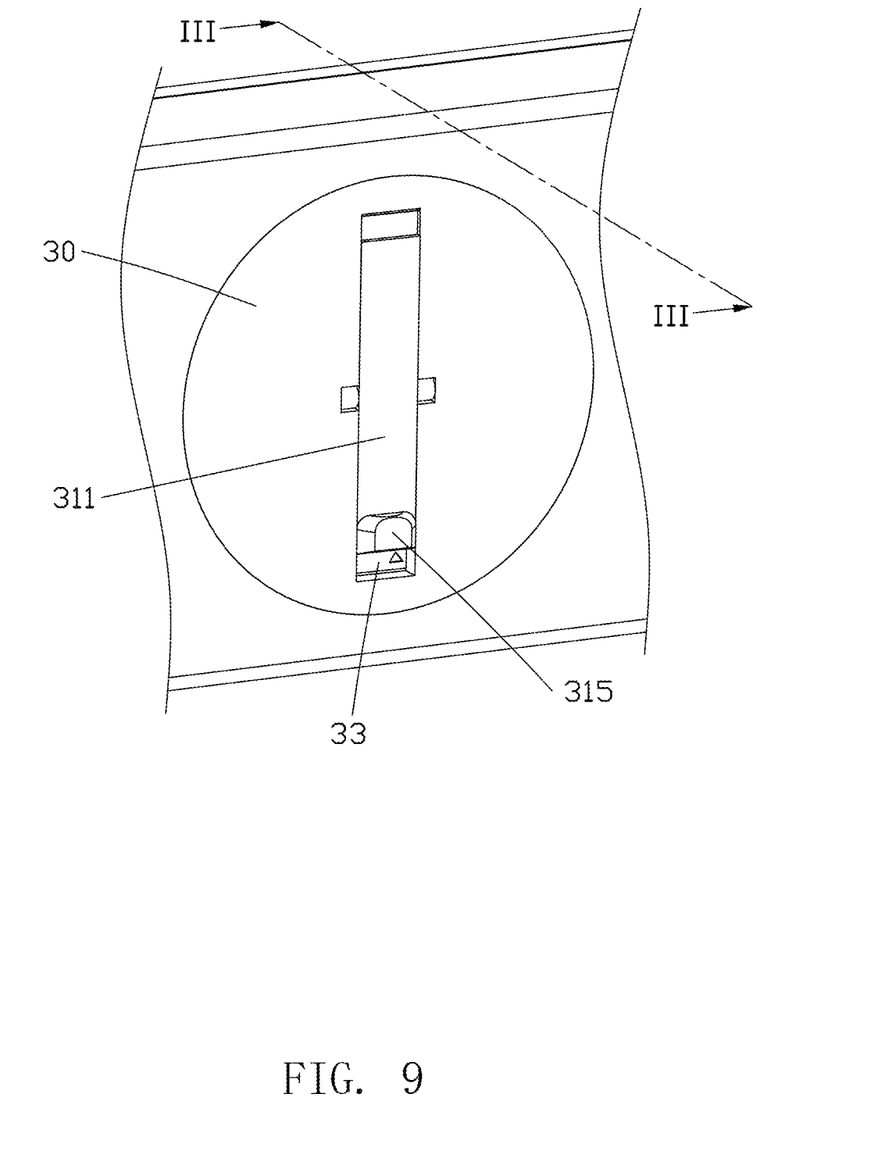
FIG. 9 is a perspective view of the handle concealed within the turntable in FIG. 7.

According to further embodiments, as shown in FIG. 7, FIG. 8, and FIG. 9, the turntable 30 is equipped with a handle 31, and the turntable 30 defines a receiving groove 32 for receiving the handle 31. The handle 31 is in the shape of a semi-circular ring and includes a flat rotating body 311 and a semi-circular gripping body 312 end-to-end connected with the rotating body 311. The rotating body 311 matches the shape of the receiving groove 32. The handle 31 further includes a shaft 313 connected to the rotating body 311, and the rotating body 311 is rotatably arranged in the receiving groove 32 by the shaft 313 such that the handle 31 can rotate to be fully received in the receiving groove 32.

Therefore, the handle 31 can rotate by rotating the rotating body 311 around the shaft 313, causing the gripping body 312 to protrude from the turntable 30, i.e., from the housing 10. This allows a user to conveniently rotate the turntable 30 by manipulating the handle 31. Alternatively, the handle 31 can rotate by rotating the rotating body 311 around the shaft 313, causing the gripping body 312 to be received the receiving space 13 of the housing 10, allowing the handle 31 to be housed within the receiving space 13 of the housing 10. This ensures that there are no protruding parts outside the housing 10 of the heat dissipation module 100, improving the appearance and avoiding interference with other components within the electronic device.

Figure 10:
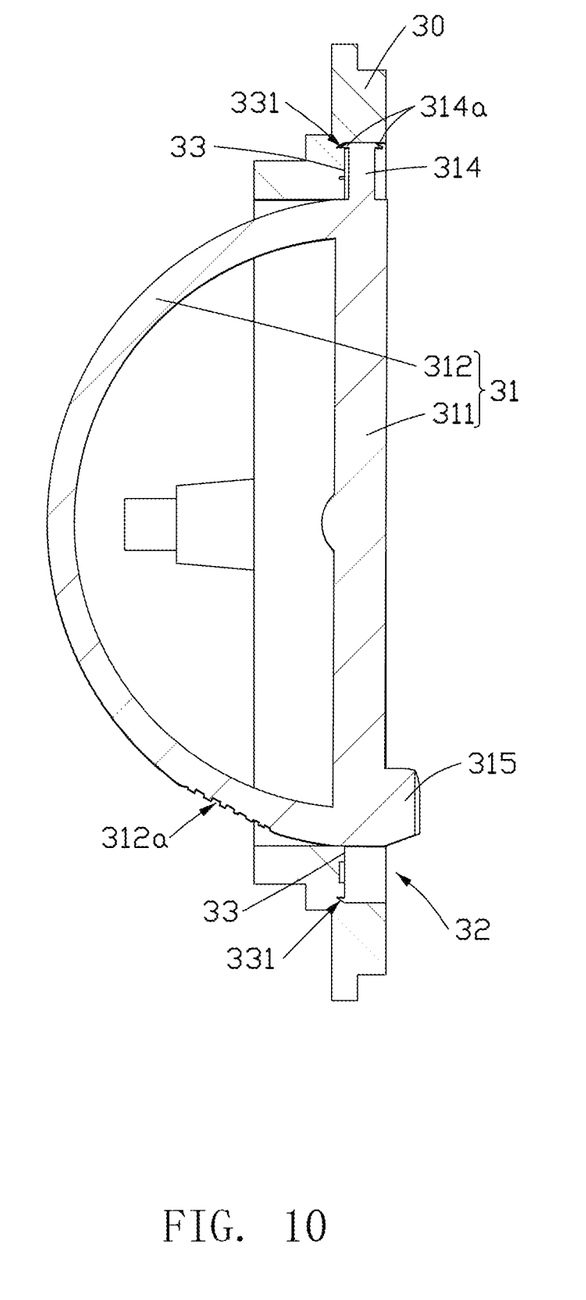
FIG. 10 is a cross section view of the turntable along the plane III-III as shown in FIG. 9.

According to some embodiments, as shown in FIG. 7 and FIG. 10, the receiving groove 32 is provided with two stop steps 33 at both ends, which protrude from side wall of the receiving groove 32. The rotating body 311 includes a screw-in end 311a and an screw-out end 311b. The screw-in end 311a is opposite to the screw-out end 311b. The rotating body 311 is equipped with a stop member 314 at the screw-out end 311b, the stop member 314 extends along the rotating body 311 and protrudes from the handle 31. When the handle 31 is rotated to fully accommodate the gripping body 312 within the receiving space 13 of the housing 10, the stop member 314 abuts against one of the stop steps 33. When the handle 31 is rotated to fully protrude the gripping body 312 from the housing 10, the stop member 314 abuts against the other one of the stop steps 33.

Therefore, when the handle 31 is rotated until the stop member 314 abuts against the stop step 33, the stop step 33 prevents further rotation of the handle 31, ensuring that the handle 31 is accurately positioned in a state where the gripping body 312 is fully protruded from the housing 10 or fully accommodated within the receiving space 13 of the housing 10 in FIG. 3. Additionally, the stop steps 33 prevent the stop member 314 from rotating into the receiving space 13 of the housing 10, and the stop member 314 can only move between the two stop steps 33 in a range outside the receiving space 13.

According to some embodiments, as shown in FIG. 8 and FIG. 10, the stop member 314 is equipped with a locking hook 314a, and a locking groove 331 is defined in the stop step 33 correspondingly. When the stop member 314 abuts against the stop step 33, the locking hook 314a engages with the locking groove 331.

According to some embodiments, as shown in FIG. 7 and FIG. 8, the rotating body 311 is provided with a boss 315 at the screw-in end 311a. The boss 315 protrudes from the turntable 30 when the stop member 314 abuts against the stop step 33 and the gripping body 312 is fully accommodated within the receiving space 13 of the housing 10. This facilitates user identification and application of force to the screw-in end 311a.

According to some embodiments, the gripping body 312 is also provided with sipes 312a near the screw-in end 311a of the rotating body 311. These sipes 312a increase the surface roughness of the gripping body 312, making it easier for users to apply force to the gripping body 312 when rotating it from the receiving groove 32 into the receiving space 13.

According to some embodiments, as shown in FIG. 4, the heat dissipation module 100 further includes an air guide plate 60. The air guide plate 60 is located within the receiving space 13 and connected between the two side walls 12. The expansion mechanism 40 is positioned between the top plate 11 and the air guide plate 60. The air guide plate 60 separates structures such as the fan 20 from the expansion mechanism 40 and prevents airflow generated by the fan 20 from overflowing from the top plate of the housing, directing the airflow of the fan 20 from one side wall 12 to the other side wall 12.

Figure 11:
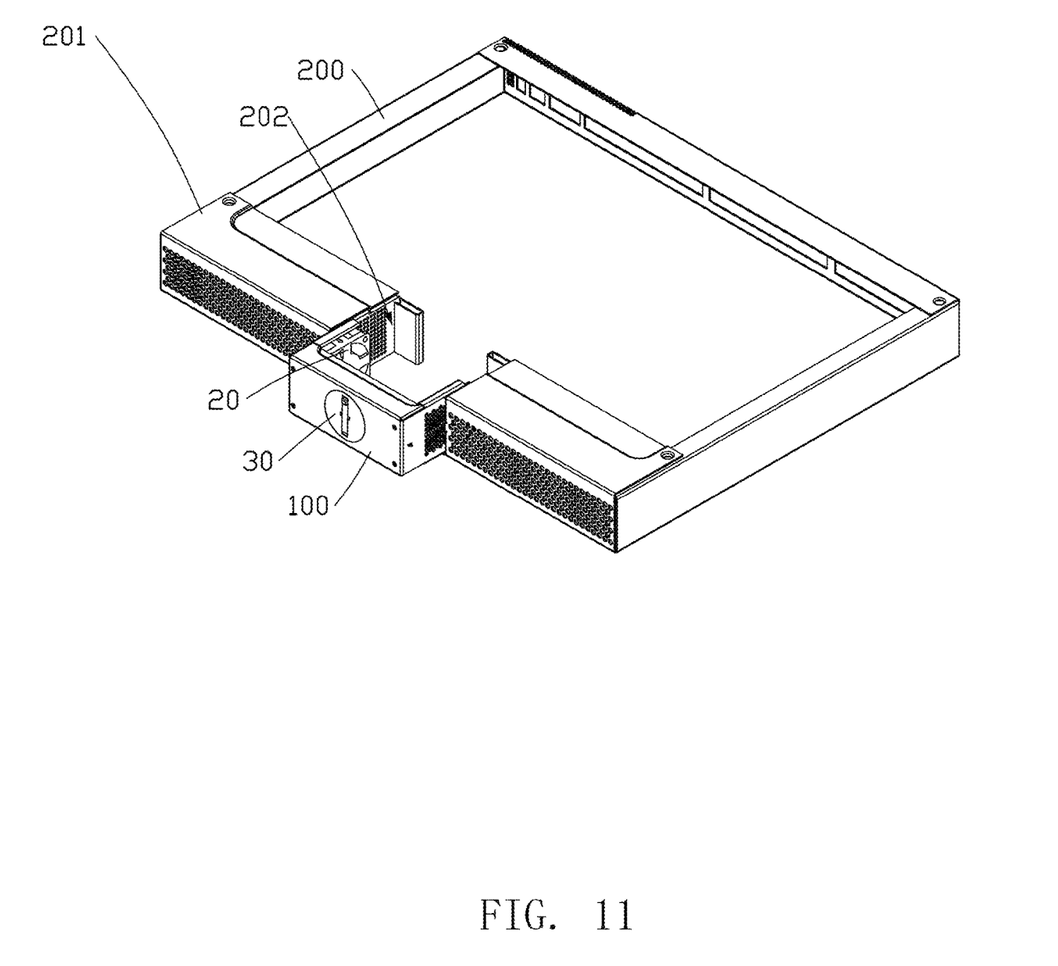
FIG. 11 is a perspective view of an electronic device according to an embodiment of the present application.
Figure 12:
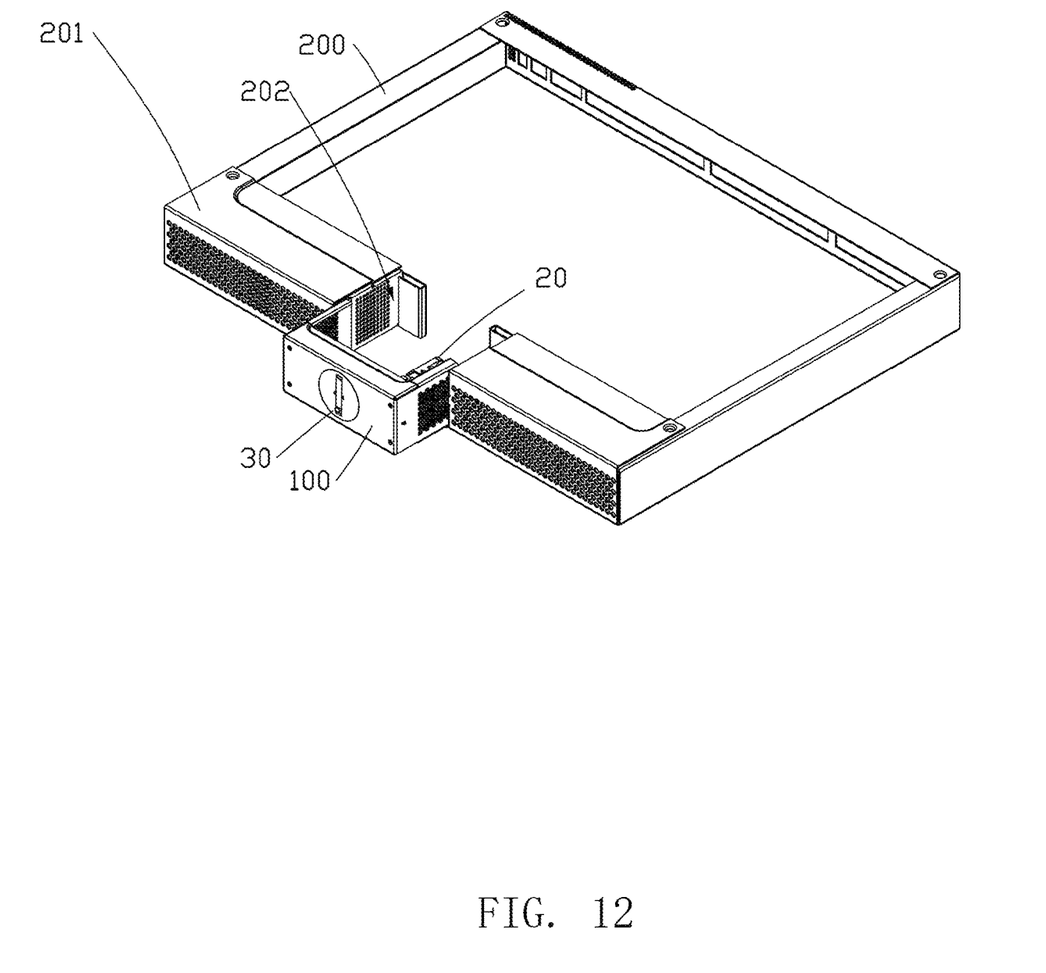
FIG. 12 is a perspective view of the electronic device in FIG. 11, with the dissipation module installed in another state.

According to some embodiments, as shown in FIG. 11 and FIG. 12, the disclosure also provides an electronic device 200 including the heat dissipation module 100 as mentioned above. The electronic device 200 includes a shell 201 defining an installation slot 202, where the heat dissipation module 100 can be detachably installed. The installation slot 202 is shaped to match the heat dissipation module 100, allowing the heat dissipation module 100 to be removed and reinstalled in the slot by flipping it 180° to change the airflow direction within the electronic device 200.

While the disclosure has been described in detail in connection with only a limited number of embodiments, it should be readily understood for the skilled in the art that the disclosure is not limited to such disclosed embodiments. Rather, the disclosure can be modified to incorporate any number of variations, alterations, substitutions, or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description but is only limited by the scope of the appended claims.

What is claimed is:

1. A heat dissipation module comprising:
   a housing comprising a top plate and two side walls connected to opposite ends of the top plate, the top plate and the two side walls define a receiving space, the top plate defines a mounting hole, and each of the two side walls defines a through hole;
   a fan accommodated in the receiving space, the fan is configured for generating airflow from one of the two side walls to another one of the two side walls;
   a turntable rotatably positioned in the mounting hole; and
   an expansion mechanism accommodated in the receiving space, the expansion mechanism comprises two sets of linkage assemblies symmetrically arranged relative to the turntable, and the two sets of linkage assemblies are connected to the turntable, the turntable is configured for selectively rotating into a locked position, where the two sets of linkage assemblies extend through the through holes on the two side walls and protrude from the housing, and the turntable is configured for selectively rotating to deviate from the locked position, for the two sets of linkage assemblies to retract into the housing via the through holes on the two side walls.

2. The heat dissipation module of claim 1, wherein a first end of each of the two sets of linkage assemblies is rotatably connected to the turntable, an second end of each of the two sets of linkage assemblies is movably inserted into the through hole in one of the two side walls, the second end is away from the first end, and
   when the turntable is in the locked position, the second end of each of the two sets of linkage assemblies inserted into a corresponding through hole and protrudes from the housing, and when the turntable deviates from the locked position, the two sets of the linkage assemblies are driven close to each other by the turntable and causing the second end of each of the two sets of linkage assemblies to retract back into the housing.

3. The heat dissipation module of claim 1, wherein
each of the two sets of linkage assemblies comprises a swing rod and a locking rod rotatably connected to the swing rod, the swing rod comprises a pivot end and a swing end away from the pivot end, the locking rod comprises a locking end and a transmission end away from the locking end,
the pivot end of the swing rod is rotatably mounted on the turntable, the swing end of the swing rod is rotatably connected to the transmission end of the locking rod, and the locking end of the locking rod is movably inserted into the through hole, and
when the turntable is in the locked position, the locking end of the locking rod protrudes from the housing via the through hole, and when the turntable deviates from the locked position, the swing rod is pulled, driving the locking rod to retract the locking end into the housing.

4. The heat dissipation module of claim 3, wherein the top plate is equipped with two limiting members on opposite sides of the mounting hole, each of the locking rods penetrates through and moves along one of the two limiting members when the turntable rotates.

5. The heat dissipation module of claim 4, further comprising a mounting plate, wherein the mounting plate is positioned within the receiving space and connected to the top plate, the mounting hole extends through the mounting plate, and the limiting members are arranged on the mounting plate.

6. The heat dissipation module of claim 5, wherein the each of the two sets of linkage assemblies comprises a resilient member sleeved on the locking rod, the resilient member abuts between a limiting member of the two limiting members and the locking end of the locking rod for pressing the locking end to protrude from the housing.

7. The heat dissipation module of claim 6, wherein each of the locking rods is equipped with a flange near the locking end, and the resilient members abut between the limiting members and the flanges.

8. The heat dissipation module of claim 1, wherein the turntable is equipped with a handle and defines a receiving groove for receiving the handle, and
the handle is in a shape of a semi-circular ring, the handle comprises a flat rotating body and a semi-circular gripping body end-to-end connected with the flat rotating body, the handle further comprises a shaft connected to the flat rotating body, and the flat rotating body is rotatably arranged in the receiving groove by the shaft such that the handle can rotate to be fully received in the receiving groove.

9. The heat dissipation module of claim 8, further comprising an air guide plate located within the receiving space, the air guide plate is connected between the two side walls, the expansion mechanism is positioned between the top plate and the air guide plate, and the fan is positioned on a side of the air guide plate away from the top plate.

10. An electronic device comprising:
a shell defining an installation slot;
a heat dissipation module detachably installed in the installation slot, the heat dissipation module comprising:
a housing comprising a top plate and two side walls connected to opposite ends of the top plate, the top plate and the two side walls define a receiving space, the top plate defines a mounting hole, and each of the two side walls defines a through hole;
a fan accommodated in the receiving space, the fan is configured for generating airflow from one of the two side walls to another one of the two side walls;
a turntable rotatably positioned in the mounting hole; and
an expansion mechanism accommodated in the receiving space, the expansion mechanism comprises two sets of linkage assemblies symmetrically arranged relative to the turntable, and the two sets of linkage assemblies are connected to the turntable, the turntable is configured for selectively rotating into a locked position, where the two sets of linkage assemblies extend through the through holes on the two side walls and protrude from the housing, and the turntable is configured for selectively rotating to deviate from the locked position, for the two sets of linkage assemblies to retract into the housing via the through holes on the two side walls; and
the housing has a symmetrical shape such that the heat dissipation module can be turned over and reinstalled in the electronic device to change the airflow direction of the heat dissipation module.

11. The electronic device of claim 10, wherein a first end of each of the two sets of linkage assemblies is rotatably connected to the turntable, an second end of each of the two sets of linkage assemblies is movably inserted into the through hole in one of the two side walls, the second end is away from the first end, and
when the turntable is in the locked position, the second end of each of the two sets of linkage assemblies inserted into a corresponding through hole and protrudes from the housing, and when the turntable deviates from the locked position, the two sets of the linkage assemblies are driven close to each other by the turntable and causing the second end of each of the two sets of linkage assemblies retracts back into the housing.

12. The electronic device of claim 10, wherein
each of the two sets of linkage assemblies comprises a swing rod and a locking rod rotatably connected to the swing rod, the swing rod comprises a pivot end and a swing end away from the pivot end, the locking rod comprises a locking end and a transmission end away from the locking end,
the pivot end of the swing rod is rotatably mounted on the turntable, the swing end of the swing rod is rotatably connected to the transmission end of the locking rod, and the locking end of the locking rod is movably inserted into the through hole, and
when the turntable is in the locked position, the locking end of the locking rod protrudes from the housing via the through hole, and when the turntable deviates from the locked position, the swing rod is pulled, driving the locking rod to retract the locking end into the housing.

13. The electronic device of claim 12, wherein the top plate is equipped with two limiting members on opposite sides of the mounting hole, each of the locking rods penetrates through and moves along one of the two limiting members when the turntable rotates.

14. The electronic device of claim 13, further comprising a mounting plate, wherein the mounting plate is positioned within the receiving space and connected to the top plate, the mounting hole extends through the mounting plate, and the limiting members are arranged on the mounting plate.

15. The electronic device of claim 14, wherein the each of the two sets of linkage assemblies comprises a resilient member sleeved on the locking rod, the resilient member abuts between a limiting member of the two limiting members and the locking end of the locking rod for pressing the locking end to protrude from the housing.

16. The electronic device of claim 15, wherein each of the locking rods is equipped with a flange near the locking end, and the resilient members abut between the limiting members and the flanges.

17. The electronic device of claim 10, wherein the turntable is equipped with a handle and defines an receiving groove for receiving the handle, and
  the handle is in a shape of a semi-circular ring, the handle comprises a flat rotating body and a semi-circular gripping body end-to-end connected with the flat rotating body, the handle further comprises a shaft connected to the flat rotating body, and the flat rotating body is rotatably arranged in the receiving groove by the shaft such that the gripping body is rotatably and fully received in the receiving groove.

18. The electronic device of claim 17, further comprising an air guide plate located within the receiving space, the air guide plate is connected between the two side walls, the expansion mechanism is positioned between the top plate and the air guide plate, and the fan is positioned on a side of the air guide plate away from the top plate.

* * * * *